US009324739B1

(12) United States Patent  
Shih et al.

(10) Patent No.: US 9,324,739 B1  
(45) Date of Patent: Apr. 26, 2016

(54) THIN FILM TRANSISTORS WITH METAL OXYNITRIDE ACTIVE CHANNELS FOR ELECTRONIC DISPLAYS

(71) Applicants: Ishiang Shih, Brossard (CA); Andy Shih, Brossard (CA); Cindy Qiu, Brossard (CA); Julia Qiu, Brossard (CA); Yi-Chi Shih, Los Angeles, CA (US); Chunong Qiu, Brossard (CA)

(72) Inventors: Ishiang Shih, Brossard (CA); Andy Shih, Brossard (CA); Cindy Qiu, Brossard (CA); Julia Qiu, Brossard (CA); Yi-Chi Shih, Los Angeles, CA (US); Chunong Qiu, Brossard (CA)

(*) Notice: Subject to any disclaimer, the term of this patent is extended or adjusted under 35 U.S.C. 154(b) by 0 days.

(21) Appl. No.: 14/121,896

(22) Filed: Nov. 3, 2014

(51) Int. Cl.  
*H01L 27/12* (2006.01)  
*H01L 29/786* (2006.01)  
*H01L 27/32* (2006.01)

(52) U.S. Cl.  
CPC ........ *H01L 27/1251* (2013.01); *H01L 27/1214* (2013.01); *H01L 27/1222* (2013.01); *H01L 27/1225* (2013.01); *H01L 27/3262* (2013.01); *H01L 29/7869* (2013.01)

(58) Field of Classification Search  
CPC ............ H01L 27/1224; H01L 27/1222; H01L 27/1225; H01L 27/1251; H01L 27/3262; H01L 27/1214  
See application file for complete search history.

(56) References Cited

U.S. PATENT DOCUMENTS

| | | | |
|---|---|---|---|
| 5,936,291 A * | 8/1999 | Makita ............... | H01L 21/28158 257/349 |
| 2010/0051959 A1* | 3/2010 | Moriwaki ......... | H01L 29/42384 257/72 |
| 2010/0301340 A1* | 12/2010 | Shih ................... | H01L 29/78609 257/59 |
| 2011/0309876 A1* | 12/2011 | Terai .................. | H01L 29/7869 327/534 |
| 2012/0286282 A1* | 11/2012 | Sugawara ........... | H01L 27/1285 257/72 |
| 2013/0134431 A1* | 5/2013 | Matsumoto ....... | H01L 21/02532 257/72 |
| 2013/0221360 A1* | 8/2013 | Tsang ............... | H01L 29/78696 257/66 |
| 2015/0034942 A1* | 2/2015 | Kim ................... | H01L 29/7869 257/43 |
| 2015/0060990 A1* | 3/2015 | Kim ................... | H01L 29/7869 257/324 |

* cited by examiner

*Primary Examiner* — Eduardo A Rodela

(57) ABSTRACT

In one embodiment of the invention, a high electron mobility thin film transistor with a plurality of gate insulating layers and a metal oxynitride active channel layer is provided for forming a backplane circuit for pixel switching in an electronic display, to reduce unwanted ON state series resistance in the metal oxynitride active channel layer and minimize unwanted power dissipation in the backplane circuit.

Another embodiment of the invention provides a high electron mobility thin film transistor structure with a plurality of metal oxynitride active channel layers and a gate insulating layer for forming a backplane circuit for pixel switching in an electronic display, to reduce unwanted ON state series resistance in the metal oxynitride active channel layer and to minimize unwanted power dissipation in the backplane circuit.

In yet another embodiment of the invention a high electron mobility thin film transistor structure with a plurality of gate insulating layers and a plurality of metal oxynitride active channel layers for forming a backplane circuit for pixel switching in an electronic display, to reduce unwanted ON state series resistance in the metal oxynitride active channel layers and to minimize unwanted power dissipation in the backplane circuit.

13 Claims, 4 Drawing Sheets

US 9,324,739 B1

THIN FILM TRANSISTORS WITH METAL OXYNITRIDE ACTIVE CHANNELS FOR ELECTRONIC DISPLAYS

FIELD OF THE INVENTION

This invention relates to thin film transistors with oxynitride active channels for pixel switching in electronic displays.

BACKGROUND OF THE INVENTION

There are two main technologies for electronic displays: one is liquid crystal display technology (LCD) based on liquid crystals and color filters and the other is light emitting display technology (LED) based on organic light emitting elements or inorganic light emitting elements. For the liquid crystal display technology, a simplified diagram of a pixel circuit is shown in FIG. 1a, where each pixel element can be taken as a capacitor $C_{s1,1}$, $C_{s1,2}$, $C_{s2,1}$, $C_{s2,2}$. In LED technology, similar to that in LCD technology, each pixel can be taken as an equivalent impedance or an equivalent resistance $R_{pixel}$ as shown in FIG. 1b. During the control of light intensity, the magnitude of voltage $V_{D1}$, $V_{D2}$ applied to data lines $D_1$, $D_2$ in FIG. 1a, is often kept constant. The thin film transistor ($TFT_{1,1}$, $TFT_{1,2}$, $TFT_{2,1}$, $TFT_{2,2}$) is turned ON and OFF at a relatively high frequency by applying control signals $V_{G1}$ and $V_{G2}$ to the gate lines $G_1$ and $G_2$. It should be noted that in many backplane switching circuits, more than one thin film transistors are adopted for each pixel. To simplify the description of this invention, only one single thin film transistor is shown in each pixel in FIG. 1a and FIG. 1c. The light intensity of the pixel is determined by the duty cycle of the switching signals $V_{G1}$ and $V_{G2}$. During such pixel switching, the voltage applied to the data line $V_D$ as shown in FIG. 1b is divided into two main portions: one is across the pixel cell $V_{pixel}$ and the other is across the thin film transistor $V_{TFT}$, which is equal to $V_D$-$V_{pixel}$. When the TFT in FIG. 1b or FIG. 1c is turned on, a current $I_{pixel}$ will be allowed to flow first through the thin film transistor TFT with an ON state resistance of $R_{TFT}$ then the pixel cell in the pixel and the total electric power is $P_{tot}=I_{pixel}^2[R_{TFT}+R_{pixel}]$. Here $I_{pixel}^2/R_{pixel}=P_{pixel}$ is the power portion to drive the LCD pixel or LED pixel and is directly related to light emission whereas the power portion $I_{pixel}^2R_{TFT}=P_{TFT}$ represents the unwanted power dissipation in the switching thin film transistor TFT which can not contribute directly to light emission. Therefore, the percentage of the unwanted power dissipation in the TFT is: $P_{TFT}/P_{tot}=I_{pixel}^2R_{TFT}/I_{pixel}^2[R_{TFT}+R_{pixel}]=R_{TFT}/[R_{TFT}+R_{pixel}]$. As the value $R_{TFT}$ is proportional to resistivity, ρ, of the active channel layer of the TFT in ON state, channel length, L (given by the distance between the drain edge and source edge), and is inversely proportional to the cross-sectional area of the active channel layer, A so that $R_{TFT}=\rho L/A$. In order to increase the switching energy efficiency or to reduce the unwanted power dissipation in the TFT of a pixel cell, the resistivity ρ of the active channel layer for TFTs in the backplane switching circuits must be kept as small as possible.

It is noted that the equivalent circuit in FIG. 1b may also be used to represent a pixel for an OLED display given in FIG. 1c. In FIG. 1c, there is only one single thin film transistor for the given pixel without a storage capacitor and such a circuit is called a one transistor pixel circuit or 1T pixel circuit. However, in a 1T pixel circuit the TFT will be turned off as the voltage $V_{G1}$, $V_{G2}$ applied to gate line $G_1$, $G_2$ (see FIG. 1a) is removed and the OLED pixel will also be turned off. In order to main the flow of a current $I_{pixel}$ after the gate voltage $V_G$ has been removed, a pixel circuit as shown in FIG. 1d may be adopted. When a given Gate Line is scanned, the voltage $V_{GTFT1}$ applied to gate $G_1$ of an address transistor TFT1 will turn on thin film transistor TFT1 when $V_{GTFT1} \geq V_{T1}$ the threshold voltage of TFT1, so that a Data Line voltage $V_D$ will be connected through TFT1 to gate $G_2$ of a second thin film transistor TFT2 (a drive thin film transistor) and a first current $I_{T1}$ will be allowed to flow to raise the gate voltage $V_{GTFT2}$ of the second thin film transistor TFT2. When $V_{GTFT2}$ is equal or greater than threshold voltage of TFT2 $V_{T2}$, TFT2 is turned on and a second current $I_{T2}$ will be allowed to flow from a Power Line with $V_{dd}$ voltage through the OLED pixel to turn the OLED pixel element on and emit light. When the voltage $V_{GTFT1}$ is removed, charges established on capacitor $C_{SS}$ will remain so that $V_{GTFT2}$ will remain to be substantially greater than $V_{T2}$ so the TFT2 will remain in an ON state and the light emission from the OLED pixel element will continue. The second current is determined by: $I_{T2}=V_{dd}[R_{T2}+R_{LED}]$, here, $R_{T2}$ is the unwanted resistance of TFT2 in an ON state and $R_{LED}$ is the parasitic resistance of the OLED pixel in ON state. The total power dissipation due to the flow of the second current $I_{T2}$ in the OLED pixel is $P_{tot2}=I_{T2}^2[R_{T2}+R_{LED}]$ whereas the one due to the flow of $I_{T1}$ is $P_{tot1}\sim I_{T1}^2[R_{T1}+R_{CO}]$ where $R_{T1}$ is the unwanted resistance of TFT1 in ON state and $R_{CO}$ is the overall impedance or resistance of $C_{SS}$ and input gate terminal of TFT2. It is noted that in the above two expressions, $P_{TFT2}=I_{T2}^2R_{T2}$ and $P_{TFT1}=I_{T1}^2R_{T1}$ are the unwanted power dissipation. In order to increase the switching power efficiency, both $P_{TFT2}$ and $P_{TFT1}$ should be kept as small as possible. In FIG. 1d, there are two thin film transistors and one capacitor for a given pixel and such pixel driving circuit is called a 2T1C circuit.

It is noted that there are possible characteristic non-uniformities between pixels caused by variation in threshold voltage ($V_T$) and hysteresis of TFTs. These non-uniformities can cause quality degradation in OLEDs displays. To overcome these drawbacks, more complicated driving circuits are often required such as: 4T1C, 6T2C etc. Therefore, for the driving of electronic display pixels such as OLED pixels, address thin film transistors are required for gate scanning where as drive thin film transistors are adopted for ON-OFF switching to supply currents to selected pixels. In FIG. 1d, a simplified driving circuit is shown to have two thin film transistors $TFT_1$, $TFT_2$ and a storage capacitor $C_{SS}$ used to drive an organic light emitting diode pixel OLED. A gate line voltage $V_{GTFT1}$ is supply to the Gate Line for sequential scanning and to turn on $TFT_1$ when $V_{GTFT1}$ is applied so that Data Line voltage $V_{data}$ will be connected through thin film transistor $TFT_1$ to gate $G_2$ of second thin film transistor TFT2. When said first thin film transistor $TFT_1$ is turned on, the first current $I_{T1}$ is flowing through the equivalent resistance $R_{T1}$ of the first thin film transistor in ON state to charge the storage capacitor $C_{SS}$ and gate capacitor $C_{T2}$ for the second thin film transistor TFT2. It is noted that the storage capacitor $C_{SS}$ is between gate $G_2$ and $D_2$ drain of said second thin film transistor TFT2 so that the gate voltage $V_{GTFT2}$ will be maintained when scanning of gate lines proceeds to subsequent rows. The $V_{GTFT2}$ is greater than the threshold voltage $V_{TTFT2}$ of thin film transistor $TFT_2$, $TFT_2$ is turned on and a second current $I_{T2}$ is allowed to flow from a power line with a power line voltage $V_{dd}$ through said second thin film transistor and OLED pixel, causing light emission from the OLED pixel. It is noted that in practical second thin film transistor, there is an unwanted series ON state resistance $R_{T2}$ connected to an equivalent resistance $R_{LED}$ of the OLED pixel in ON state. In an ON state for the OLED pixel in FIG. 1d, the power dissipation components in said first thin film transistor $TFT_1$: $I_{T1}^2 R_{T1}$ and second thin film transistor $TFT_2$: $I_{T2}^2 R_{T2}$ must be kept as small as possible.

For a field effect transistor, the total resistance $R_{total}$ between drain and source in the ON state is equal to $R_{TFT}$ (see FIG. 1(c)), and is given by the sum of a channel layer resistance $R_{ch}$ and a contact resistance of drain contact and source contacts $R_C$:

$$R_{TFT}=R_{total}=R_{ch}+R_C=L/[WC_i(V_{GS}-V_T)\mu_{ch}]+R_C$$

Here $C_i$ and $\mu_{ch}$ are the capacitance per unit area of gate insulator layer and the channel mobility of charge carriers, respectively. The contact resistance $R_C$ is determined by the barrier height between drain metal and the channel layer semiconductor, barrier height between source metal and the channel layer semiconductor, and the area of the drain contact and source contacts. The contact resistance $R_C$ is often made smaller than the channel layer resistance $R_{ch}$. Therefore, the total resistance of a TFT $R_{TFT}$ may be considered to be mainly due to the channel layer resistance $R_{ch}$. Therefore, for a TFT having fixed geometry with given values of channel length L, channel width W and $V_{GS}-V_T$, it is preferable to select the channel layer so that the channel mobility $\mu_{ch}$ is as large as possible.

To compare different thin film transistor technologies, a normalized channel resistance or a specific channel resistance given by $R_{ch}$ W may be used with W as the channel width. For a given TFT technology, the normalized channel resistance or specific channel resistance $R_{ch}$ W should be made as small as possible in order to reduce the unwanted heat dissipation in the TFTs during switching of pixels. It should be pointed out that with a fixed channel width the specific channel resistance is primarily determined by the channel layer semiconductors. For instance for TFTs having organic semiconductors as channel layers, values of the specific channel resistance $R_{ch}$ W is in a range of $3\times10^5$ to $2\times10^6$ ohm-cm. For the most popular a-Si TFTs adopted currently in many electronic displays, the specific channel resistance values are ranging from $10^5$ to $2\times10^6$ ohm-cm. For polycrystalline silicon thin film transistors (p-Si TFTs), the specific channel resistance is about 400 ohm-cm due to larger carrier mobilities in the order of 100 cm$^2$/V-sec. For an metal oxide thin film transistor or metal oxide TFT with an InGaZnO channel, the specific channel resistance value is about 500 ohm-cm.

SUMMARY OF THE INVENTION

One object of this invention is to provide a thin film transistor structure with a plurality of gate insulating layers and a first metal oxynitride active channel layer to form a backplane for pixel switching in an electronic display, to enhance mobility of charge carriers, reduce unwanted ON state series resistance in the metal oxynitride active channel layer and to minimize unwanted power dissipation in the back plane.

Another object of this invention is to provide a thin film transistor structure with a plurality of metal oxynitride active channel layers and a first gate insulating layers for forming a backplane for pixel switching in an electronic display, to enhance mobility of charge carriers, reduce unwanted ON state series resistance in the metal oxynitride active channel layer and to minimize unwanted power dissipation in the back plane.

Still another object of this invention is to provide a thin film transistor structure with a plurality of gate insulating layers and a plurality of metal oxynitride active channel layers to form a backplane for pixel switching in an electronic display, to enhance mobility of charge carriers, to reduce un-wanted ON state series resistance in said metal oxynitride active channel layers and to minimize the un-wanted power dissipation in said back plane.

DETAIL DESCRIPTION OF THE PREFERRED EMBODIMENTS

In thin film transistors (TFTs), the effective charge carrier mobility, $\mu_{eff}$ in the channel layers at a given temperature is determined by the intrinsic charge carrier mobility of the semiconductor: $\mu_o$ and various scattering mechanisms at the same temperature. The intrinsic charge carrier mobility $\mu_o$ is material specific. The effective charge carrier mobility along with the charge carrier density determines the specific channel resistance $R_{ch} \times W$. In fabricated TFTs, the effective charge carrier mobility $\mu_{eff}$ is often less than the intrinsic charge carrier mobility due to the following scattering mechanisms: (1) phonon scattering from lattice vibrations which are temperature dependent, (2) Coulomb scattering arising from charged centers such as fixed charges in gate insulators, charges at interface states and charges due to ionized impurity atoms and (3) surface roughness scattering. As the phonon scattering is temperature dependent, the effects have already been reflected in the value of intrinsic charge carrier mobility, $\mu_o$. In order to minimize the unwanted power dissipation in the TFTs during switching in an electronic display or operation in an microwave and millimeter wave integrated circuit MMIC, the effective charge carrier mobility $\mu_{eff}$ should be made as close to the intrinsic charge carrier mobility $\mu_o$ as possible. A comparison of mobility and parameters for thin film transistors based on different semiconductors for active channel layers in different technologies including the one based on metal oxynitrides in this invention is given in Table 1.

TABLE 1

Comparison of TFT technologies based on different channel semiconductors.

| TFT channel | poly-crystalline Si | amor-phous Si | metal oxide | metal oxynitride |
|---|---|---|---|---|
| Effective Mobility | 100 cm²/V-sec | 1 cm²/V-sec | 10 cm²/V-sec | >200 cm²/V-sec |
| Substrate Temperature | 500° C. | 300° C. | ~100° C. | ~200° C. |
| TFT type | PMOS | NMOS | NMOS | NMOS |
| TFT masks | 5-11 | 4-6 | 5-7 | 5-7 |

Figure 1A:
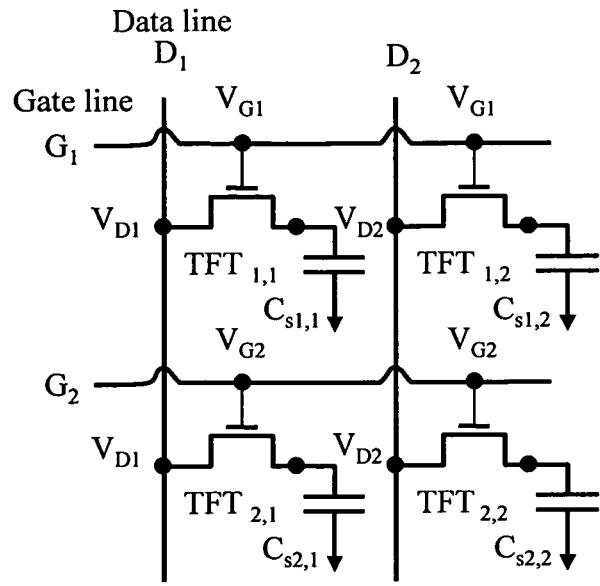
FIG. 1a shows a simplified schematic diagram for a pixel circuit for electronic displays where gate lines $G_1$, $G_2$ are sequentially scanned with data fed to data lines $D_1$, $D_2$ to control the pixel elements which are represented by $C_{si,j}$. The pixel thin film transistor $TFT_{i,j}$ is turned on and off by the voltages applied to the gate lines.
Figure 1B:
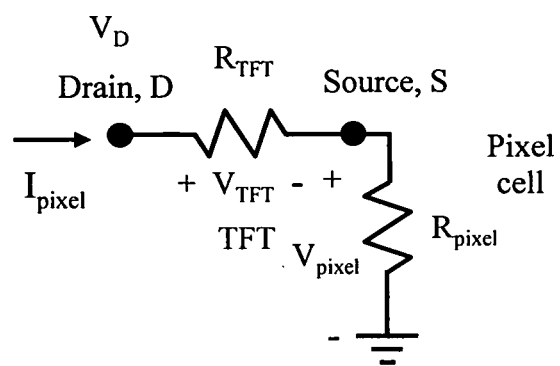
FIG. 1b shows a schematic circuit diagram for a pixel cell showing equivalent resistance or impedance $R_{TFT}$ of the switching thin film transistor TFT in series with the equivalent resistance or impedance of the pixel cell Rpixel. $R_{TFT}$ contributes to the unwanted energy dissipation in the TFT during the switching operation and should be made as small as possible.
Figure 1C:
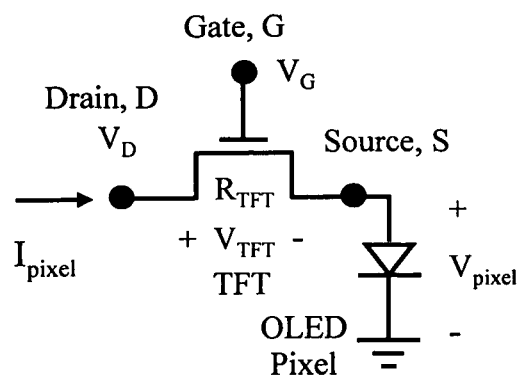
FIG. 1c shows a schematic circuit diagram for a pixel cell in an OLED display showing a TFT with an ON state resistance $R_{TFT}$ and an OLED pixel element with a pixel cell resistance $R_{pixel}$. $R_{TFT}$ contributes to the unwanted energy dissipation during the switching operation and should be as small as possible to increase the energy efficiency.
Figure 1D:
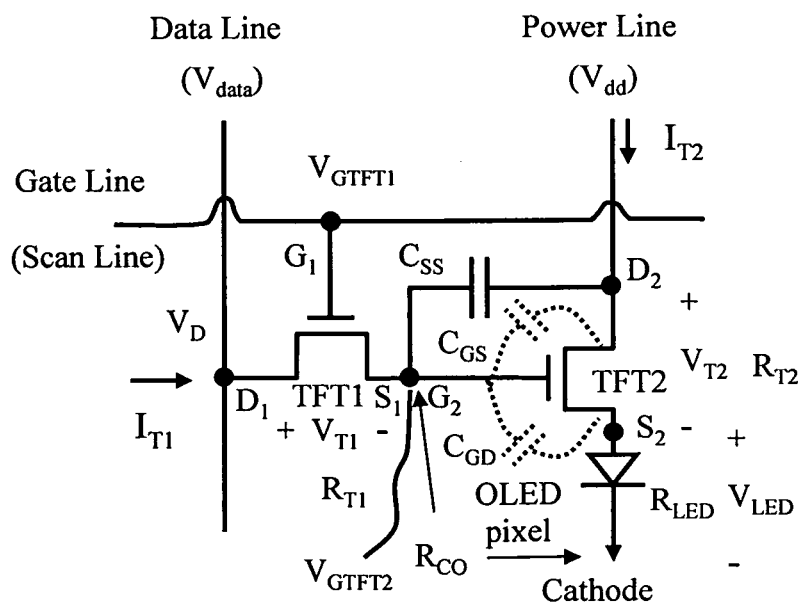
FIG. 1d A simplified schematic equivalent circuit of an OLED pixel where $TFT_1$ is the switching transistor, $TFT_2$ is the driving transistor and $C_s$ is the storage capacitor. Whereas $C_{GS}$ and $C_{GD}$ are parasitic capacitances associated with the $TFT_2$, and OLED is represented by a diode with an ON state resistance of $R_{LED}$.
Figure 2A:
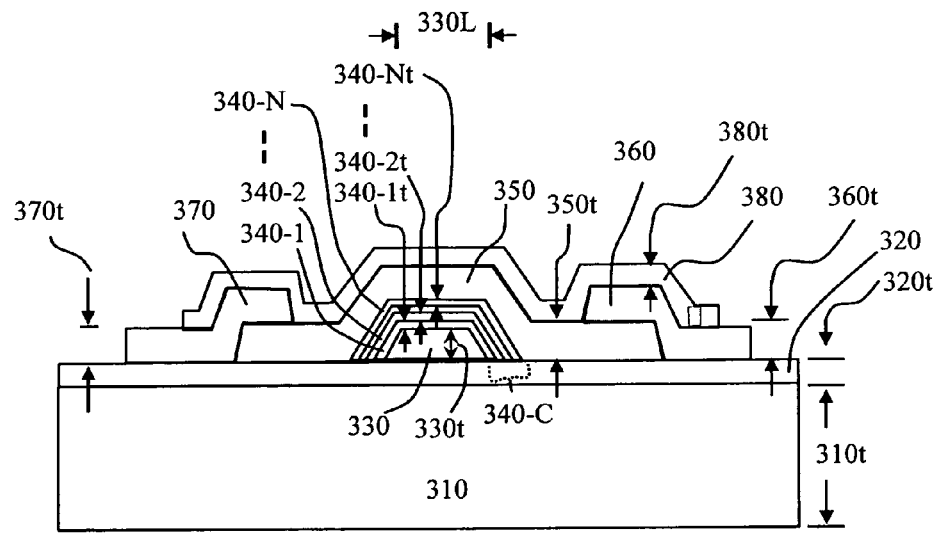
FIG. 2a A schematic diagram of a thin film transistor (300Ta) with a metal oxynitride first active channel layer, a first gate layer, a drain, a source, and a plurality of gate insulating layers forming a combined gate insulating layer (340-C) for controlling of gate insulating layer fixed charges and for further control of threshold voltage of the TFT.

According to one embodiment of the invention, a high mobility thin film transistor (300Ta) is provided in FIG. 2a for forming a backplane circuit for switching of pixels in an electronic display or for an MMIC. This thin film transistor (300Ta) comprises a substrate (310) having a substrate thickness (310t), a first substrate passivation layer (320) with a first substrate passivation layer thickness (320t), at least a first gate layer (330) with a first gate layer thickness (330t) and a first gate layer length (330L), a plurality of gate insulating layers (340-1, 340-2 - - -, 340-N) each having a gate insulating layer thickness (340-1t, 340-2t - - -, 340-Nt), forming a combined gate insulating layer (340-C), a metal oxynitride first active channel layer (350) with a first active channel layer thickness (350t), a source layer (360) having a source layer thickness (360t), a drain layer (370) having a drain layer thickness (370t), and a first surface passivation layer (380) having a first surface passivation layer thickness (380t). The combined gate insulating layer (340-C) constitutes at least one gate insulating layer pairs: (340-1-340-2), - - -, (340-N-1-340-N). In each of the gate insulating layer pairs, there is a first gate insulating layer which is adjacent or closer to the first gate layer (330) and a second gate insulating layer which is adjacent or closer to the metal oxynitride first active channel layer (350). In each first gate insulating layer of the gate insulating layer pairs, there is a first fixed charge type and a first fixed charge density $Q_{1f}$ and in each second gate insulating layer of the gate insulating layer pairs, there is a second fixed charge type and a second fixed charge density $Q_{2f}$.

The first fixed charge type in the first gate insulating layers may be selected to be opposite to the second fixed charge type in the second gate insulating layers, whereas the value of the first fixed charge density is selected to be substantially the same as that of the second fixed charge density. This is done to reduce total or net effective fixed charge density in each gate insulating layer pair and thus in the combined gate insulating layer (340-C), for the purposes of reducing unwanted Coulomb scattering between fixed charges in the combined gate insulating layers (340-C) and charge carriers in the metal oxynitride first active channel layer (350) and increasing mobility of the charge carriers.

The first fixed charge type in the first gate insulating layers may also be selected to be the same as the second fixed charge type in the second gate insulating layers. In such a case, the value of the gate insulating layer fixed charge density of the gate insulating layer immediately next to the metal oxynitride first active channel layer (350) is controlled to be substantially smaller than fixed charge density values of gate insulating layers not adjacent to the metal oxynitride first active channel layer (350) for the purposes of reducing unwanted Coulomb scattering and increasing mobility of the charge carriers.

In addition to increasing the charge carrier mobility in the metal oxynitride first active channel layer (350), the threshold voltage of the high mobility thin film transistor (300Ta) may also be controlled or adjusted by adjusting the fixed charge type and fixed charge density in the gate insulating layer pairs of the combined gate insulating layers (340-C). The first fixed charge type in the first gate insulating layers of the gate insulating layer pairs is selected preferably to be a positive fixed charge type and such a positive fixed charge type may be obtained in oxides such as aluminum oxide ($Al_2O_3$) or silicon oxide ($SiO_2$) and their mixtures. The positive fixed charge type can also be obtained in mixtures of insulators such as: zirconium oxide, hafnium oxide, silicon nitride, aluminum nitride, hafnium nitride, and strontium titanate. The first fixed charge density, $Q_{1f}$ is controlled by controlling the first gate insulating layer thickness for the gate insulating layer pairs and by controlling the processing conditions. According to this invention, the second fixed charge type in the second gate insulating layers of the gate insulating layer pairs may be selected to be opposite to that of the first gate insulating layers. When the first fixed charge type is positive, the second fixed charge type is then negative. Such a negative fixed charge type may be obtained in oxides such as zirconium oxide ($ZrO_2$) or hafnium oxide ($HfO_2$) and their mixtures. The negative fixed charge type can also be obtained in mixtures of insulators such as: silicon dioxide, silicon nitride, aluminum oxide, aluminum nitride, hafnium nitride, and strontium titanate. The second fixed charge density, $Q_{2f}$ is controlled by controlling the second gate insulating layer thickness for the gate insulating layer pairs and by controlling the processing conditions. The value of the first fixed charge density $Q_{1f}$ in the first gate insulating layer is controlled to be substantially close to the second fixed charge density $Q_{2f}$ in the second gate insulating layer in each of the gate insulating layer pairs. Hence, the total net fixed charge density $Q_f$ in each of the gate insulating layer pairs will be substantially smaller than $Q_{1f}$ and $Q_{2f}$: $Q_f = Q_{1f} - Q_{2f}$. As an accumulative result, the next fixed charge density in the combined gate insulating layer (340-C) may be controlled and minimized.

The substrate (310) is selected from a group including: glass, plastic, ceramic and metal sheets whereas the first substrate passivation layer (320) may be selected from a material group of: silicon dioxide, silicon nitride, aluminum oxide, aluminum nitride, hafnium oxide, hafnium nitride, zirconium oxide strontium titanate, and their combinations. The material for the combined gate insulating layers (340-C) may be selected from a group including: silicon dioxide, silicon nitride, aluminum oxide, aluminum nitride, hafnium oxide, hafnium nitride, zirconium oxide, strontium titanate, and their combinations. Material of the metal oxynitride first active channel layer (350) is selected from a group of metal oxynitrides: indium oxynitride, zinc oxynitride, gallium oxynitride, tin oxynitride, cadmium oxynitride, aluminum oxynitride, germanium oxynitride, titanium oxynitride, silicon oxynitride and their mixtures. The first surface passivation layer may be selected from a material group including: silicon dioxide, silicon nitride, aluminum oxide, aluminum nitride, hafnium oxide, hafnium nitride, zirconium oxide, strontium titanate, and their combinations.

It is noted that when the substrate (310) is properly prepared and electrically insulating, it may not be necessary to include the first substrate passivation layer (320) and the thin film transistor (300Ta) may well be deposited directly on the substrate (310). When a metal substrate is used, the first substrate passivation layer (320) will be required in order to achieve electrical isolation between the thin film transistor and the substrate. It is further noted that aluminum oxynitride, germanium oxynitride, titanium oxynitride, silicon oxynitride are included as the material for the metal oxynitride first active channel layer (350) to increase the stability but this may lead to a decrease in effective carrier mobility. Therefore, the amounts of above oxynitrides included in the active channel layers should be small, preferably less than 1%.

With fixed charges in the gate insulator layers, the effects of Coulomb scattering of charge carriers in the metal oxynitride first active channel layer on effective carrier mobility may be described by an empirical formula: $\mu_{max\ eff} = \mu_o/[1+\alpha Q_f]$. Here $\mu_{max\ eff}$ is the maximum effective mobility, $\mu_o$ is the intrinsic carrier mobility of the active channel semiconductor, $\alpha$ is a factor which is dependent on a doping concentration, $N_A$, of the semiconductor and $Q_f$ is the surface fixed charge density in the combined gate insulating layers (340-C in FIG. 2a) (about $10^{11}$ cm$^{-2}$). It is noted that for field effect transistors using channel semiconductors having the same doping concentration, $\mu_{max\ eff}$ decreases by more than 50% as the surface fixed charge density $Q_f$ is increased from $10^{11}$ cm$^{-2}$ to $10^{12}$ cm$^{-2}$.

Therefore, by selecting the first fixed charge type in the first gate insulating layers to be opposite to the second fixed charge type in the adjacent second gate insulating layers and by controlling their densities, the effective net fixed charge density in a gate insulating layer pairs and thus in the combined gate insulating layers (340-C) may be controlled and reduced. When the first fixed charge type is selected to be the same as the second fixed charge type, the fixed charge type in the gate insulating layer immediately next to the first active channel layer is preferably controlled to be negative and the value of the fixed charge density of the same gate insulating layer should be controlled to be substantially smaller than the fixed charge density in adjacent gate insulating layers.

Figure 2B:
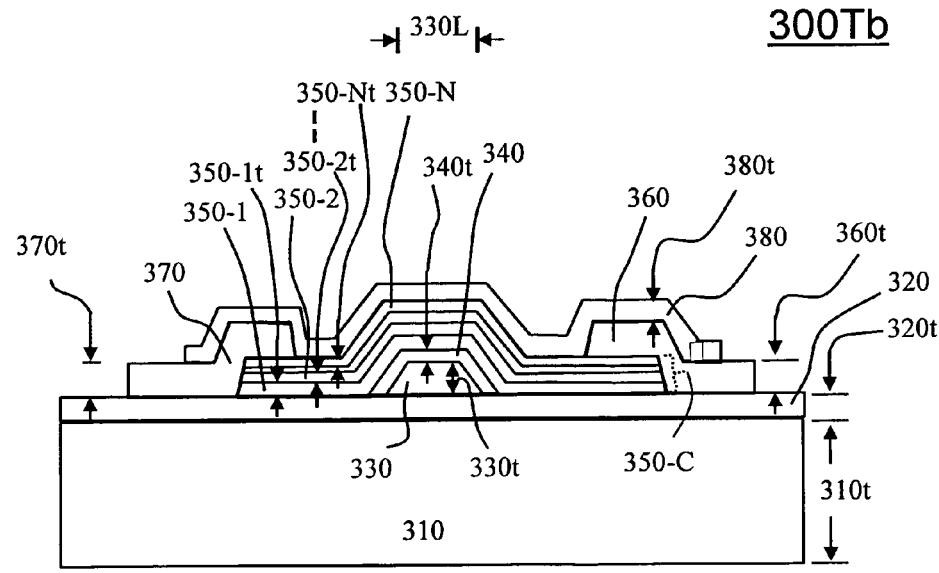
FIG. 2b shows a schematic diagram of a thin film transistor (300Tb) with a first gate layer, a first gate insulating layer, a plurality of metal oxynitride active channel layers forming a combined metal oxynitride active channel layer (350-C) for controlling charge carrier density in the second active channel layer and increasing charge carry mobilities.

According to another embodiment of the present invention, a high mobility thin film transistor TFT (300Tb) is provided in FIG. 2b for forming a backplane circuit for switching of pixels in an electronic display or for an MMIC. The high mobility thin film transistor (300Tb) comprises a substrate (310) with a substrate thickness (310t), a first substrate passivation layer (320) with a first substrate passivation layer thickness (320t), a first gate layer (330) with a first gate layer length (330L) and a first gate layer thickness (330t), a first gate insulating layer (340) having a first gate insulating layer thickness (340t), a plurality of metal oxynitride active channel layers (350-1, 350-2 - - - 350-N, N=4 in FIG. 2b for simplicity) forming a combined metal oxynitride active channel layer (350-C), a source layer (360) having a source layer thickness (360t), a drain layer (370) having a drain layer thickness (370t), and a first surface passivation layer (380) having a first surface passivation layer thickness (380t). Each active channel layer in the combined metal oxynitride active channel layer (350-C) has an active channel layer thickness (350-1t, 350-2t - - - 350-Nt) and an active channel layer energy gap. The first gate insulating layer (340) has a first gate insulating layer fixed charge type and a first gate insulating layer fixed charge density $Q_{1f}$.

The first metal oxynitride active channel layer (350-1) has a first active channel layer energy gap which is selected to be substantially larger than a second active channel layer energy gap for the second metal oxynitride active layer (350-2) so that charge carriers will be confined in the second metal oxynitride active channel layer (350-2) and not in the first metal oxynitride active channel layer (350-1) adjacent to the first gate insulating layer (340). Intrinsic charge carrier mobility in the second active channel layer (350-2) is selected to be substantially larger than 200 cm$^2$/V-sec and more preferably greater than 500 cm$^2$/V-sec by having a small second active channel layer energy gap. In other word, the substantially smaller second active channel layer energy gap will promote confinement of charge carriers in the second active channel layer (350-2) which has a large intrinsic charge carrier mobility. Mobility of the charge carriers is increased further by a reduced unwanted Coulomb scattering of charge carriers in the metal oxynitride active channel layers with fixed charges in the first gate insulating layer (340). The first gate insulating layer (340) has a first fixed charge type (either positive or negative) and a first fixed charge density. The first fixed charge density is minimized by controlling the first gate insulating layer thickness (340t) and through adjusting fabrication conditions.

Hence, by selecting the first metal oxynitride active channel layer (350-1) to have a first active channel layer energy gap substantially greater than the second active channel layer energy gap and by selecting the first active channel intrinsic charge carrier mobility in the first active channel layer substantially smaller than the second intrinsic carrier mobility in the second active channel layer (350-2), charge carriers are confined in the second active channel layer (350-2) and the thin film transistor (300Tb) would have a high charge carrier mobility.

In addition to improving the charge carrier mobility in the combined metal oxynitride active channel layer (350-C), the threshold voltage of the thin film transistor (300Tb) may also be controlled or adjusted by adjusting the first fixed charge type and the first fixed charge density in the first gate insulating layer (340). The first fixed charge type may be selected to be either positive or negative but more preferably to be a negative fixed charge type. The negative fixed charge type may be obtained in oxides such as zirconium oxide (ZrO$_2$), hafnium oxide (HfO$_2$) and their mixtures or a mixture with insulators such as: silicon dioxide, silicon nitride, aluminum oxide, aluminum nitride, hafnium nitride, strontium titanate, and their combinations. The first gate insulating layer fixed charge density, $Q_{1f}$ is minimized by controlling or adjusting the first gate insulating layer thickness (340t) and by optimizing the processing conditions so that unwanted Coulomb scattering of charge carriers in the metal oxynitride active channel layers (350-1, 350-2, - - - 350-N) is reduced, to increase further effective mobility of the charge carriers.

The substrate (310) is selected from a group including: glass, plastic, ceramic and metal sheets and the first substrate passivation layer (320) may be selected from a material group including: silicon dioxide, silicon nitride, aluminum oxide, aluminum nitride, hafnium oxide, hafnium nitride, zirconium oxide, strontium titanate and their combinations. The first gate insulating layer (340) may be selected from a group of oxides and nitrides including: silicon dioxide, silicon nitride, aluminum oxide, aluminum nitride, hafnium oxide, hafnium nitride, zirconium oxide, strontium titanate and their combinations. Each of the combined metal oxynitride active channel layer (350-C) has a metal oxynitride active channel layer energy gap and the materials of the active channel layers are selected from a group including: indium oxynitride, zinc oxynitride, gallium oxynitride, tin oxynitride, cadmium oxynitride, aluminum oxynitride, germanium oxynitride, titanium oxynitride, silicon oxynitride and their mixtures. Finally, the first surface passivation layer (380) may be selected from a material groups of: silicon dioxide, silicon nitride, aluminum oxide, aluminum nitride, hafnium oxide, hafnium nitride, zirconium oxide strontium titanate and their combinations. When the substrate (310) is properly prepared or electrically insulating, it may not be necessary to include the first substrate passivation layer (320) and the thin film transistor (300Tb) may be deposited directly on the substrate (310). When a metal substrate is used, the first substrate passivation layer (320) will be required in order to achieve electrical isolation between the thin film transistor and the substrate. It is further noted that aluminum oxynitride, germanium oxynitride, titanium oxynitride, silicon oxynitride are included to increase the stability of the metal oxynitride active channel layers (350-1, - - - 350-N) but those may lead to a decrease in effective carrier mobility. Therefore, the amounts of the above oxynitrides included in the active channel layers should be small, preferably less than 1%.

Figure 2C:
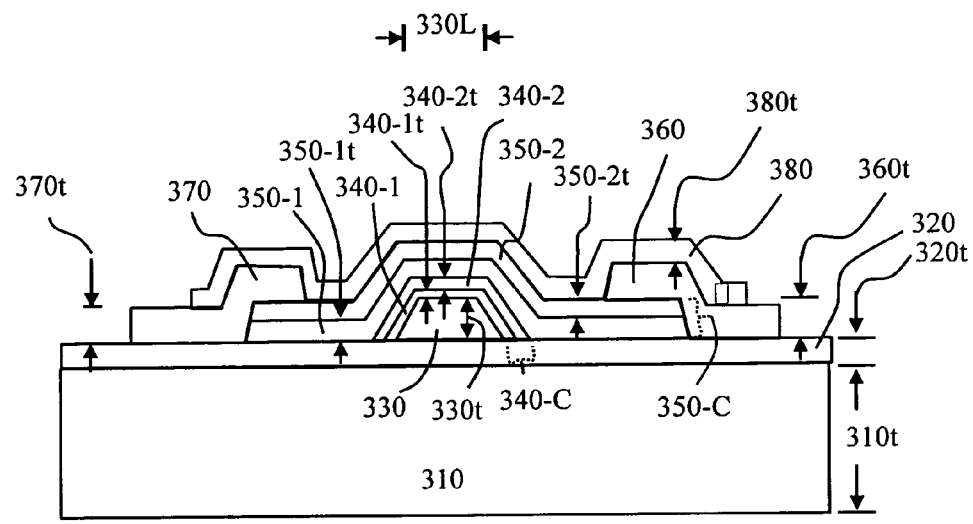
FIG. 2c A schematic diagram of a thin film transistor (300Tc) with a plurality of gate insulating layers forming a combined gate insulating layer (340-C) and a plurality of metal oxynitride active channel layers forming a combined active channel layer (350-C) for controlling charge carrier density in the second active channel layer in order to increasing charge carry mobility and for controlling of gate insulator charges to further control threshold voltage of the TFT.

According to still another embodiment of this invention, a high mobility thin film transistor (300Tc) is provided in FIG. 2c for forming a backplane circuit for switching pixels in an electronic display or for MMIC. It comprises a substrate (310) having a substrate thickness (310t), a first substrate passivation layer (320) with a first substrate passivation layer thickness (320t), a first gate layer (330) with a first gate layer thickness (330t) and a first gate length (330L), a plurality of gate insulating layers (340-1 - - - 340-N, N=2 in FIG. 2c for simplicity) forming a combined gate insulating layer (340-C), a plurality of metal oxynitride active channel layers (350-1 - - - 350-N, N=2 in FIG. 2c for simplicity) forming a combined metal oxynitride active channel layer (350-C), a source layer (360) having a source layer thickness (360t), a drain layer (370) having a drain layer thickness (370t), a first surface passivation layer (380) having a first surface passivation layer thickness (380t). Each of the combined gate insulating layer (340-C) has a gate insulating layer thickness (340-1t - - - 340-Nt) and each of the combined metal oxynitride active channel layer (350-C) has an active channel layer thickness (350-1t - - - 350-Nt).

The combined gate insulating layer constitutes at least one gate insulating layer pairs: (340-1-340-2), - - -, (340-N-1-340-N). In each of the gate insulating layer pairs, there is a first gate insulating layer which is adjacent or closer to the first gate layer (330) and a second gate insulating layer which is adjacent or closer to a first active channel layer (350-1). In each first gate insulating layer of each of the gate insulating layer pairs, there is a first fixed charge type and a first fixed charge density $Q_{1f}$. In each second gate insulating layer of each of the gate insulating layer pairs, there is a second fixed charge type and a second fixed charge density $Q_{2f}$.

In TFT (300Tc), each metal oxynitride active channel layer in the combined metal oxynitride active channel layer (350-C) has an active channel layer energy gap and an active channel intrinsic charge carrier mobility. The first energy gap of the first metal oxynitride active channel layer (350-1) is selected to be substantially larger than the second energy gap of the second metal oxynitride active layer (350-2) so that charge carriers will be confined in the second metal oxynitride active channel layer (350-2) and not in the first active channel layer (350-1) which is adjacent to the gate insulating layers (340-C). In addition, the intrinsic carrier mobility in the second active channel layer (350-2) is selected to be substantially larger than 200 $cm^2$/N-sec and more preferably greater than 500 $cm^2$/V-sec. In other word, the substantially smaller second active channel layer energy gap will promote confinement of charge carriers in the second active channel layer (350-2) having a large intrinsic charge carrier mobility.

Therefore, by selecting the first metal oxynitride active channel layer (350-1) to have a first energy gap substantially greater than the second active channel layer energy gap and to have a first intrinsic carrier mobility substantially smaller than the second intrinsic carrier mobility in said second active channel layer (350-2), charge carriers are confined in the second active channel layer and would have a large mobility. Effective charge carry mobility is further increased by reduced unwanted Coulomb scattering between fixed charges in the combined gate insulating layers (340-C) and charge carriers in the combined metal oxynitride active channel layers (350-C). To do so, the first fixed charge type in the first gate insulating layer of each gate insulating layer pairs may be selected to be opposite to the second fixed charge type in the second gate insulating layer in each of the gate insulating layer pairs, whereas the first fixed charge density $Q_{1f}$ is selected to be substantially the same as the second fixed charge density $Q_{2f}$ in each gate insulating layer pair, to reduce total effective or net fixed charge density in each of the gate insulating layer pairs and hence in the combined gate insulating layer (340-C). The first fixed charge type in the first gate insulating layer may also be selected to be the same as the second fixed charge type in the second gate insulating layer. In such a case, the value of the gate insulating layer fixed charge density of the gate insulating layer immediately next to the combined metal oxynitride first active channel layer (350-C) is controlled to be substantially smaller than fixed charge density values of gate insulating layers not adjacent to the metal oxynitride first active channel layer (350-C) for the purposes of reducing unwanted Coulomb scattering and increasing mobility of the charge carriers. Furthermore, the gate insulating layer fixed charge type in the gate insulating layer immediately next to the metal oxynitride first active channel layer (350) is selected preferably to be negative to reduce unwanted Coulomb scattering and increasing mobility of the charge carriers.

In addition to increase of the charge carrier mobility in the combined metal oxynitride active channel layers (350-C), the threshold voltage of the thin film transistor (300Tc) may be controlled or adjusted by adjusting the fixed charge type and fixed charge density in the gate insulating layers (340-1, 340-2 - - - 340-N). The second fixed charge type in the second gate insulating layer (340-2) is selected to be either positive or negative and more preferably to be a negative fixed charge type. Such a negative fixed charge type may be obtained in oxides such as zirconium oxide ($ZrO_2$) or hafnium oxide ($HfO_2$) and their mixtures or a mixture with insulators such as: silicon dioxide, silicon nitride, aluminum oxide, aluminum nitride, hafnium nitride and strontium titanate. The second fixed charge density, $Q_{2f}$, is controlled by controlling the second gate insulating layer thickness in each gate insulating layer pairs and by controlling the processing conditions.

Figure 2D:
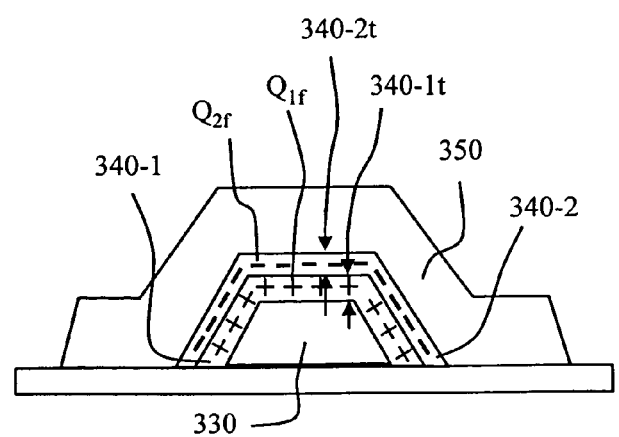
FIG. 2d A simplified cross-section of a thin film transistor portion (300Tc) showing a first gate insulating layer having first gate insulating layer fixed charge type and fixed charge density $Q_{1f}$, a second gate insulating layer (340-2) having a second gate insulating layer fixed charge type and a fixed charge density $Q_{2f}$ forming a gate insulating layer pair. The first fixed charge type is positive and the second fixed charge type is negative so that the effective or net fixed charge density in the gate insulating layer pair and the in the combined gate insulating layer (340-C) is substantially reduced and the charge carrier mobility is increased.

When the first fixed charge type in the first gate insulating layers of the gate insulating layer pairs is selected to be opposite to that of the second fixed charge type and more preferably to be a positive fixed charge type when the second gate insulating layer charge type being negative (see FIG. 2d). Such a positive fixed charge type may be obtained in oxides such as aluminum oxide ($Al_2O_3$), silicon oxide ($SiO_2$) and their mixtures or a mixture with insulators such as: zirconium oxide, hafnium oxide, silicon nitride, aluminum nitride, hafnium nitride, and strontium titanate. The first fixed charge density, $Q_{1f}$, is controlled or adjusted by controlling the first gate insulating layer thickness (e.g. 340-1t) for the gate insulating layer pairs and by controlling the fabrication conditions. The value of the first fixed charge density $Q_{1f}$ in the first gate insulating layers is controlled to be substantially close to that of the second fixed charge density $Q_{2f}$ in each of the gate insulating layer pairs. Hence, the total net fixed charge density $Q_f$ in a gate insulating layer pair will be substantially smaller than $Q_{1f}$ and $Q_{2f}$; $|Q_f|=|Q_{1f}|-|Q_{2f}|$. Thus the total net fixed charge density in the combined gate insulating layers (340-C) will be controlled and minimized so that unwanted Coulomb scattering of charge carriers in the metal oxynitride active channel layers is reduced and the effective mobility of the charge carriers is further increased.

The substrate (310) of the TFT (300Tc) is selected from a material group including: glass, plastic, ceramic and metal sheets and the first substrate passivation layer (320) may be selected from a material group including: silicon dioxide, silicon nitride, aluminum oxide, aluminum nitride, hafnium oxide, hafnium nitride, zirconium oxide, strontium titanate and their combinations. Each of the combined metal oxynitride active channel layer (350-C) has a metal oxynitride active layer energy gap and its material is selected from a group including: indium oxynitride, zinc oxynitride, gallium oxynitride, tin oxynitride, cadmium oxynitride, aluminum oxynitride, germanium oxynitride, titanium oxynitride, silicon oxynitride and their mixtures. Finally, the first surface passivation layer (380) may be selected from a material group of: silicon dioxide, silicon nitride, aluminum oxide, aluminum nitride, hafnium oxide, hafnium nitride, zirconium oxide, strontium titanate and their combinations. It is noted that when the substrate (310) is properly prepared and electrically insulating, it may not be necessary to include the first substrate passivation layer (320) and the thin film transistor (300Tc) may well be deposited directly on the substrate (310). When metal substrates are used, a first substrate passivation layer (320) will be required in order to achieve electrical isolation between the thin film transistor and the substrate. It is further noted that aluminum oxynitride, germanium oxynitride, titanium oxynitride, silicon oxynitride are included to increase the stability of the metal oxynitride active channel layers (350-1 - - - 350-N) but may lead to a decrease in effective carrier mobility. Therefore, the amounts of the above oxynitrides included in the active channel layers should be small, preferably less than 1%.

What is claimed is:

1. A high electron mobility thin film transistor with a plurality of metal oxynitride active channel layers for forming a backplane circuit for switching of pixels in an electronic display, comprises:
   a substrate having a substrate thickness;
   at least a first gate layer having a first gate layer thickness and a first gate layer length;
   a first gate insulating layer having a first gate insulating layer thickness, and containing first gate insulating layer fixed charges with a first gate insulating layer fixed charge type and a first gate insulating layer fixed charge density;
   at least a metal oxynitride first active channel layer immediately adjacent said first gate insulating layer, said first active channel layer having a first active channel layer thickness, a first active channel layer energy gap and a first active channel layer intrinsic charge carrier mobility;
   at least a metal oxynitride second active channel layer having a second active channel layer thickness, a second active channel layer energy gap and a second active channel layer intrinsic charge carrier mobility;
   a drain layer;
   a source layer; and
   a first surface passivation layer having a surface passivation layer thickness, wherein said second active channel layer intrinsic charge carrier mobility is selected to be substantially higher than said first active channel layer intrinsic charge carrier mobility, said first active channel layer energy gap is selected to be substantially greater than said second active channel layer energy gap of adjacent second active channel layer to confine charge carries in said second active channel layer.

2. A high electron mobility thin film transistor with a plurality of metal oxynitride active channel layers for forming a backplane circuit for switching of pixels in an electronic display as defined in claim 1, wherein said first active channel layer energy gap, said second active channel layer gap, said first active channel layer intrinsic charge carrier mobility and said second active channel layer intrinsic charge carrier mobility is controlled to enhance active channel layer mobility of said thin film transistor.

3. A high electron mobility thin film transistor with a plurality of metal oxynitride active channel layers for forming a backplane circuit for switching of pixels in an electronic display as defined in claim 1, wherein said substrate is selected from a material group of: glass, plastic, ceramic and metal.

4. A high electron mobility thin film transistor with a plurality of metal oxynitride active channel layers for forming a backplane circuit for switching of pixels in an electronic display as defined in claim 1, further comprising a first substrate passivation layer having a first substrate passivation layer thickness to isolate said thin film transistor from said substrate, material of said first substrate passivation layer and said first surface passivation layer may be selected from a group including: silicon dioxide, silicon nitride, aluminum oxide, aluminum nitride, hafnium oxide, hafnium nitride, zirconium oxide strontium titanate, and their combinations.

5. A high electron mobility thin film transistor with a plurality of metal oxynitride active channel layers for forming a backplane circuit for switching of pixels in an electronic display as defined in claim 1, wherein material of each of said metal oxynitride active channel layers is selected from a material group of: indium oxynitride, zinc oxynitride, gallium oxynitride, tin oxynitride, cadmium oxynitride, aluminum oxynitride, germanium oxynitride, titanium oxynitride, silicon oxynitride and their mixtures.

6. A high electron mobility thin film transistor with a plurality of metal oxynitride active channel layers for forming a backplane circuit for switching of pixels in an electronic display as defined in claim 1, wherein material of said first gate insulating layer is selected from a group including: silicon dioxide, silicon nitride, aluminum oxide, aluminum nitride, hafnium oxide, hafnium nitride, zirconium oxide, strontium titanate, and their combinations.

7. A high electron mobility thin film transistor with a plurality of metal oxynitride active channel layers for forming a backplane circuit for switching of pixels in an electronic display as defined in claim 1, further comprising a control of a fixed charge density and a fixed charge type in said first gate insulating layer to enhance channel carrier mobility and to control threshold voltage of said high electron mobility thin film transistor.

8. A high electron mobility thin film transistor with a plurality of gate insulating layers and a plurality of metal oxynitride active channel layers for forming a backplane circuit for switching of pixels in an electronic display, comprising:
   a substrate having a substrate thickness;
   a first substrate passivation layer having a first substrate passivation layer thickness;
   at least a first gate layer having a first gate layer thickness and a first gate layer length;
   at least a first gate insulating layer and a second gate insulating layer, each of said gate insulating layers having a gate insulating layer thickness, and containing gate insulating layer fixed charges with a gate insulating layer fixed charge type and a gate insulating layer fixed charge density;
   at least a metal oxynitride first active channel layer having a first active channel layer thickness, a first active channel layer energy and a first active channel layer intrinsic charge carrier mobility;
   at least a metal oxynitride second active channel layer having a second active channel layer thickness, a second active channel layer energy gap and a second active channel layer intrinsic charge carrier mobility;
   a drain layer;
   a source layer; and
   a first surface passivation layer having a surface passivation layer thickness, wherein said second active channel layer intrinsic charge carrier mobility is selected to be substantially higher than said first active channel layer intrinsic charge carrier mobility, said first active channel layer energy gap is selected to be substantially greater than said second active channel layer energy gap of adjacent second active channel layer to confine charge carries in said second active channel layer.

9. A high electron mobility thin film transistor with a plurality of gate insulating layers and a plurality of metal oxynitride active channel layers for forming a backplane circuit for switching of pixels in an electronic display as defined in claim 8, further comprising a control of said fixed charge density and said fixed charge type in each of said gate insulating layers to enhance charge carrier mobility of said active channel layers and to control threshold voltage of said high electron mobility thin film transistor.

10. A high electron mobility thin film transistor with a plurality of gate insulating layers and a plurality of metal oxynitride active channel layers for forming a backplane circuit for switching of pixels in an electronic display as defined in claim 8, wherein said first active channel layer energy gap, said second active channel layer gap, said first active channel layer intrinsic charge carrier mobility and said second active channel layer intrinsic charge carrier mobility is controlled to enhance active channel layer mobility of said thin film transistor.

11. A high electron mobility thin film transistor with at least two gate insulating layers and at least two metal oxynitride active channel layers for forming a backplane circuit for switching of pixels in an electronic display as defined in claim 8, wherein material of each of said metal oxynitride active channel layers is selected from a material group of: indium oxynitride, zinc oxynitride, gallium oxynitride, tin oxynitride, cadmium oxynitride, aluminum oxynitride, germanium oxynitride, titanium oxynitride, silicon oxynitride and their mixtures.

12. A high electron mobility thin film transistor with at least two gate insulating layers and at least two metal oxynitride active channel layers for forming a backplane circuit for switching of pixels in an electronic display as defined in claim 8, wherein materials of said gate insulating layers, said first substrate passivation layer and said first surface passivation layer are selected from a group including: silicon dioxide, silicon nitride, aluminum oxide, aluminum nitride, hafnium oxide, hafnium nitride, zirconium oxide, strontium titanate, and their combinations.

13. A high electron mobility thin film transistor with at least two gate insulating layers and at least two metal oxynitride active channel layers for forming a backplane circuit for switching of pixels in an electronic display as defined in claim 8, wherein said substrate is selected from a material group of: glass, plastic, ceramic and metal.

* * * * *